(12) United States Patent
Han

(10) Patent No.: US 10,803,283 B2
(45) Date of Patent: Oct. 13, 2020

(54) DISPLAY DEVICE

(71) Applicant: SAMSUNG DISPLAY CO., LTD., Yongin-si, Gyeonggi-do (KR)

(72) Inventor: Jeong Yun Han, Yongin-si (KR)

(73) Assignee: Samsung Display Co., Ltd. (KR)

( * ) Notice: Subject to any disclaimer, the term of this patent is extended or adjusted under 35 U.S.C. 154(b) by 124 days.

(21) Appl. No.: 15/858,180

(22) Filed: Dec. 29, 2017

(65) Prior Publication Data
US 2018/0225500 A1 Aug. 9, 2018

(30) Foreign Application Priority Data

Feb. 7, 2017 (KR) ........................ 10-2017-0016918

(51) Int. Cl.
*G06K 9/00* (2006.01)
*G06F 3/041* (2006.01)
(Continued)

(52) U.S. Cl.
CPC ........... *G06K 9/0004* (2013.01); *G06F 3/044* (2013.01); *G06F 3/0412* (2013.01);
(Continued)

(58) Field of Classification Search
CPC . G06F 2203/04106; G06F 2203/04112; G06F 3/0412; G06F 3/0416; G06F 3/044; G06K 9/0004; H01L 27/3216; H01L 27/3218; H01L 27/3227; H01L 27/323; H01L 27/3234; H01L 27/3426; H01L 27/326; H01L 27/3276; H01L 51/0097
See application file for complete search history.

(56) References Cited

U.S. PATENT DOCUMENTS

2015/0331508 A1 11/2015 Nho et al.
2016/0266695 A1 9/2016 Bae et al.
2018/0089491 A1* 3/2018 Kim ...................... G06F 3/0412

FOREIGN PATENT DOCUMENTS

| CN | 105184282 A | 12/2015 |
|---|---|---|
| EP | 3196802 A1 | 7/2017 |
| WO | 2016/141777 A2 | 9/2016 |

OTHER PUBLICATIONS

Extended European Search Report, Application No. 18155548.3, dated Jun. 15, 2018, 10 pages.
(Continued)

*Primary Examiner* — Manuchehr Rahmjoo
(74) *Attorney, Agent, or Firm* — Innovation Counsel LLP

(57) ABSTRACT

There is provided a display device. The display device includes a substrate including a display area that includes a first area, a plurality of pixels provided in the display area, each of the plurality of pixels provided in the display area including a first sub-pixel, a second sub-pixel and a third sub-pixel that include light emitting areas, light emitting elements disposed in the light emitting areas of the first sub-pixel, the second sub-pixel and the third sub-pixel, a touch sensor disposed on the light emitting elements to sense a touch position of a user, and a fingerprint sensor disposed in the first area to sense light emitted from the light emitting element in accordance with the touch of the user and reflected by the user. At least one of the light emitting elements is electrically connected to an adjacent light emitting element that emits light of the same color.

18 Claims, 10 Drawing Sheets

(51) Int. Cl.
*G06F 3/044* (2006.01)
*H01L 27/32* (2006.01)
*H01L 51/00* (2006.01)

(52) U.S. Cl.
CPC .......... *G06F 3/0416* (2013.01); *H01L 27/323* (2013.01); *H01L 27/326* (2013.01); *H01L 27/3218* (2013.01); *H01L 27/3227* (2013.01); *H01L 27/3234* (2013.01); *H01L 27/3246* (2013.01); *H01L 27/3276* (2013.01); *H01L 51/0097* (2013.01); *G06F 2203/04106* (2013.01); *G06F 2203/04112* (2013.01); *H01L 27/3216* (2013.01)

(56) References Cited

OTHER PUBLICATIONS

Zhigang Li et al., "Organic Light-Emitting Materials and Devices", Sep. 12, 2006, CRC Press, p. 502.

\* cited by examiner

DISPLAY DEVICE

CROSS-REFERENCE TO RELATED APPLICATION

This application claims priority to and the benefit of Korean Patent Application No. 10-2017-0016918, filed on Feb. 7, 2017, in the Korean Intellectual Property Office, the entire contents of which are incorporated herein by reference in their entirety.

BACKGROUND

1. Field

An embodiment of the present inventive concept relates to a display device.

2. Description of the Related Art

A recent display device performs various functions as well as a function of displaying an image. Researches on a display device capable of performing a fingerprint recognizing function are being actively performed.

In general, the display device having the fingerprint recognizing function recognizes a fingerprint by an optical sensing method or a capacitance method. The display device that recognizes the fingerprint by the optical sensing method may include a photo-sensor as a fingerprint sensor. The photo-sensor recognizes the fingerprint by sensing light emitted from a display element of the display device and reflected by a finger.

On the other hand, since a display device for implementing high resolution includes wirings with a high degree of integration, an aperture ratio of the display device may be reduced. In such a case, since light transmittance is reduced, the photo-sensor may not correctly recognize the fingerprint of a user.

SUMMARY

An embodiment of the present inventive concept relates to a display device capable of increasing a fingerprint recognition rate.

A display device according to an embodiment of the present inventive concept may include a substrate including a display area that includes a first area and a second area adjacent to each other and a peripheral area that surrounds at least one side of the display area, a plurality of pixels provided in the display area, each of the plurality of pixels provided in the display area including a first sub-pixel, a second sub-pixel and a third sub-pixel, each of the first sub-pixel, the second sub-pixel and the third sub-pixel including light emitting area that emit light, light emitting elements disposed in the light emitting areas of the first sub-pixel, the second sub-pixel and the third sub-pixel, a touch sensor disposed on the light emitting elements, and a fingerprint sensor disposed in the first area. At least one of the light emitting elements is electrically connected to an adjacent light emitting element that emits light of the same color.

Light transmittance of the first area may be larger than light transmittance of the second area.

The first sub-pixel, the second sub-pixel and the third sub-pixel disposed in the second area may include pixel circuits configured to drive corresponding light emitting elements.

At least one of the first sub-pixel, the second sub-pixel and the third sub-pixel disposed in the first area does not include the pixel circuit.

The light emitting elements include a first light emitting element disposed in a light emitting area of the first sub-pixel to emit light of a first color, a second light emitting element disposed in a light emitting area of the second sub-pixel to emit light of a second color, and a third light emitting element disposed in a light emitting area of the third sub-pixel to emit light of a third color.

The light of the first color may be red light, the light of the second color may be green light, and the light of the third color may be blue light.

The third light emitting element may include a light emitting layer for emitting the blue light, a first electrode disposed between the substrate and the light emitting layer, and a second electrode disposed on the light emitting layer.

In the first area, the first electrode of the third light emitting element may be connected to a first electrode of a neighboring third light emitting element.

In the first area, some of the third sub-pixels may include the pixel circuits.

Some of the third sub-pixels may include transmissive areas that transmit light.

Light transmittance of the some of the third sub-pixels may be larger than light transmittance of the remaining third sub-pixels.

A fingerprint sensing circuit connected to the fingerprint sensor may be disposed in the transmissive area.

The fingerprint sensor may be an image sensor.

The touch sensor may include at least one of a self-capacitance touch sensor and a mutual capacitance touch sensor.

The touch sensor may include a first touch electrode and a second touch electrode separate from the first touch electrode to form capacitance with the first touch electrode.

The display device further may include a plurality of thin film transistors disposed in the display area and be respectively connected to the light emitting elements.

A display device according to another embodiment of the present inventive concept may include a substrate including a display area that includes a first area and a second area adjacent to each other and a peripheral area that surrounds at least one side of the display area, a plurality of pixels provided in the display area, each of the plurality of pixels provided in the display area including a first sub-pixel, a second sub-pixel and a third sub-pixel, each of the first sub-pixel, the second sub-pixel and the third sub-pixel including light emitting area that emit light, and light emitting elements disposed in the light emitting areas of the first sub-pixel, the second sub-pixel and the third sub-pixel. At least one of the light emitting elements may be electrically connected to adjacent light emitting elements that emit light of the same color.

According to an embodiment of the present inventive concept, it is possible to provide a display device capable of increasing a fingerprint recognition rate.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The present inventive concept may be modified variably and may have various embodiments, particular examples of which will be illustrated in drawings and described in detail. However, it is to be understood that the present inventive concept is not limited to a specific disclosed form, but includes all modifications, equivalents, and substitutions without departing from the scope and spirit of the present inventive concept.

In describing drawings, like numbers refer to like elements. In the accompanying drawings, dimensions of structures are exaggerated to clarify the present inventive concept. While terms such as "first" and "second," etc., may be used to describe various elements, such elements must not be understood as being limited to the above terms. The above terms are used only to distinguish one component from another. For example, a first component may be referred to as a second component without departing from the scope of rights of the present inventive concept, and likewise a second component may be referred to as a first component. As used herein, the singular forms "a", "an" and "the" are intended to include the plural forms as well, unless the context clearly indicates otherwise.

In the present application, it is to be understood that the terms such as "including" or "having," etc., are intended to indicate the existence of the features, numbers, operations, actions, elements, parts, or combinations thereof disclosed in the specification, and are not intended to preclude the possibility that one or more other features, numbers, operations, actions, elements, parts, or combinations thereof may exist or may be added. In addition, it will be understood that when an element such as a layer, a film, an area, or a substrate is referred to as being "on" another element, it can be directly on the other element or intervening elements may also be present. Conversely, it will be understood that when an element such as a layer, a film, an area, or a substrate is referred to as being "beneath" another element, it can be directly on the other element or intervening elements may also be present.

Hereinafter, embodiments of the present inventive concept will be described in more detail with reference to the accompanying drawings.

Figure 1:
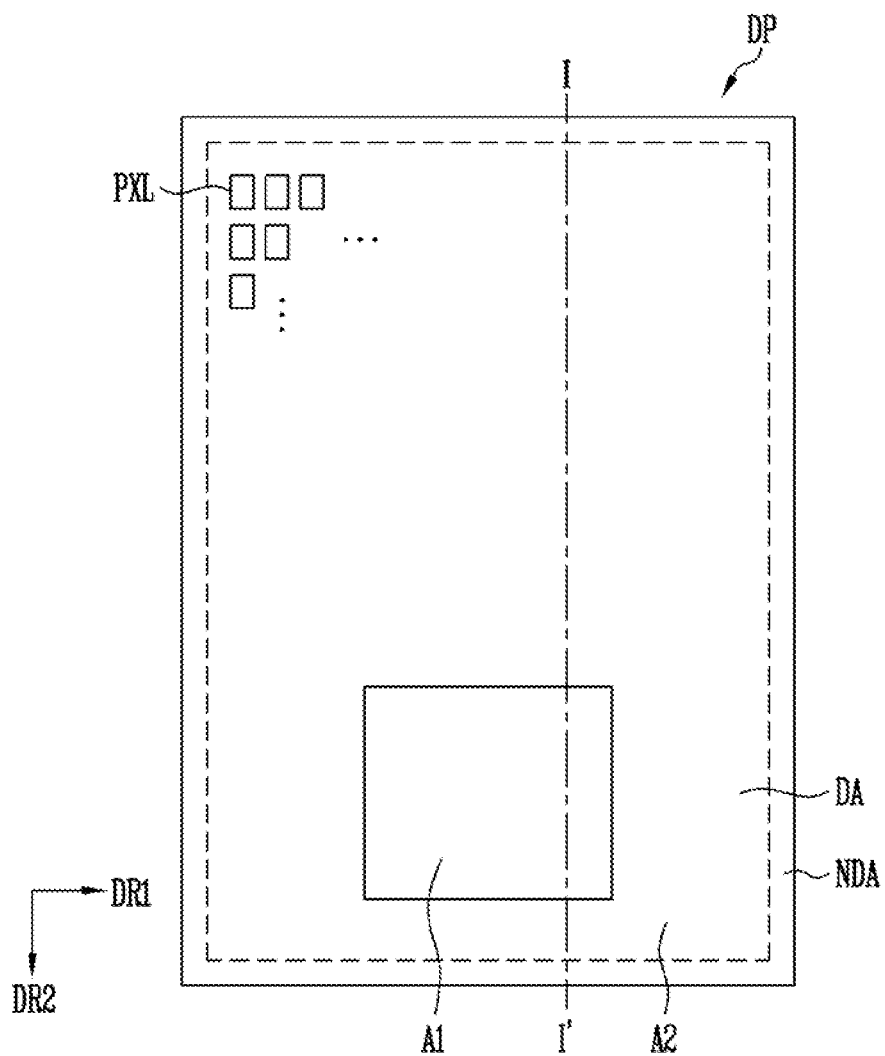
FIG. 1 is a plan view of a display device according to an embodiment of the present inventive concept.
Figure 2:
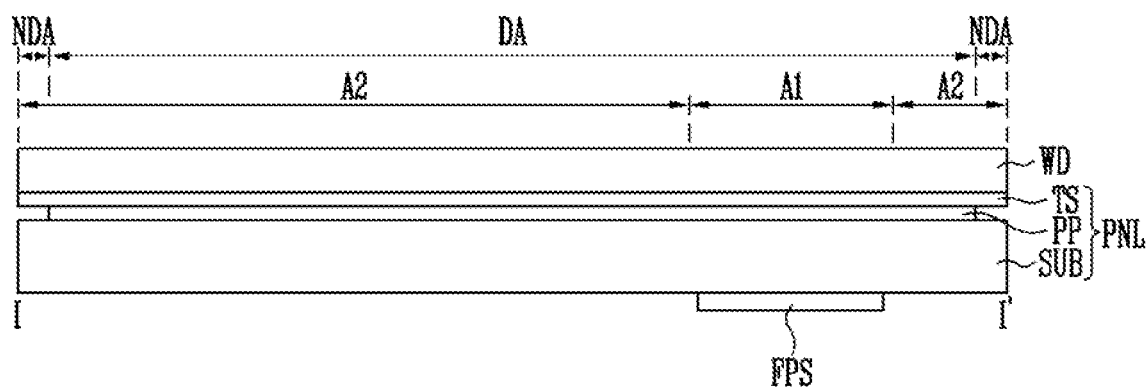
FIG. 2 is a cross-sectional view taken along the line I-I' of FIG. 1.

FIG. 1 is a plan view of a display device DP according to an embodiment of the present inventive concept. FIG. 2 is a cross-sectional view taken along the line I-I' of FIG. 1.

Referring to FIGS. 1 and 2, the display device DP according to the embodiment of the present inventive concept may include a display panel PNL and a window WD provided on a front surface of the display panel PNL.

The display panel PNL may display arbitrary visual information, for example, a text, a video, a photograph, or a two or three-dimensional image on the front surface thereof. Any display panel PNL that may display an image may be used. According to an embodiment of the present inventive concept, the display panel PNL is illustrated as being an organic light emitting display panel PNL. However, a kind of the display panel PNL is not limited thereto and another display panel PNL may be used within the scope of the present inventive concept.

The display panel PNL may have one of various shapes, for example, a rectangular plate having two pairs of sides that run parallel with each other. When the display panel PNL is the rectangular plate, one pair of sides among the two pairs of sides may be longer than the other pair of sides. According to an embodiment of the present inventive concept, for convenience sake, the display panel PNL is a rectangle having a pair of long sides and a pair of short sides.

However, the shape of the display panel PNL is not limited thereto and may vary. For example, the display panel PNL may be a closed polygon including straight sides, a circle or an ellipse including a curved side, or a semi-circle or a semi-ellipse including straight and curved sides. According to an embodiment of the present inventive concept, when the display panel PNL has the straight sides, at least parts of edges of the respective shapes may be formed of curved lines. For example, when the display panel PNL is rectangular, each part at which adjacent straight sides meet may be replaced by a curved line having a predetermined curvature.

The display panel PNL may be entirely or locally flexible.

The display panel PNL may display the image on the front surface thereof. The display panel PNL may include a display area DA provided with a display PP to display the image and a non-display area NDA positioned at least at one side of the display area DA. For example, the non-display area NDA may surround the display area DA.

The display area DA may have a shape corresponding to a shape of the display device DP. For example, the display area DA may be a closed polygon including straight sides, a circle or an ellipse including a curved side, or a semi-circle or a semi-ellipse including straight and curved sides like the display device DP. According to an embodiment of the present inventive concept, the display area DA may be rectangular.

The display area DA may include a plurality of pixel areas provided with a plurality of pixels PXL. A driver (not shown) for driving the plurality of pixels PXL may be provided in the non-display area NDA.

The display panel PNL may include a first area A1 for sensing a fingerprint and a second area A2 adjacent to the first area A1. According to an embodiment of the present inventive concept, the first area A1 may be smaller than the second area A2. The first area A1 may have a size and a shape in which the fingerprint of a user may be recognized. According to an embodiment of the present inventive concept, for convenience sake, the first area A1 is illustrated as being rectangular. However, the present inventive concept is not limited thereto. The first area A1 may be circular, elliptical, semi-circular, or polygonal. The first area A1 may be surrounded by the second area A2. The first area A1 may be completely surrounded by the second area A2. However, the present inventive concept is not limited thereto.

According to an embodiment of the present inventive concept, the first area A1 may be provided only at one side of the second area A2. The first area A1 may be provided in the display area DA. The second area A2 may be provided in the display area DA and the non-display area NDA. However, the part in which the first area A1 and the second area A2 are provided is not limited thereto and may vary. For example, a part of the first area A1 may be provided in the non-display area NDA or both the first area A1 and the second area A2 may be provided only in the display area DA.

According to an embodiment of the present inventive concept, in order to sense the fingerprint by using light that passes through the first area A1, light transmittance of the first area A1 may be larger than light transmittance of the second area A2. According to an embodiment of the present inventive concept, as the light transmittance of the first area A1 is larger, sensing ability of a fingerprint sensor FPS may be improved.

The window WD may be disposed on the front surface of the display panel PNL. The window WD may be a plate corresponding to the shape of the display panel PNL and may cover at least a part of the front surface of the display panel PNL. For example, when the display panel PNL is rectangular or circular, the window WD may be also rectangular or circular.

The window WD transmits the image from the display panel PNL and releases external shock and may prevent the display panel PNL from being damaged by the external shock or from erroneously operating due to the external shock. The external shock may mean pressure or stress that may cause defect of the display panel PNL.

The window WD may be entirely or locally flexible.

Specifically, the display panel PNL may include a substrate SUB, the display structure PP disposed on the substrate SUB, the fingerprint sensor FPS disposed on a rear surface of the substrate SUB, and a touch sensor TS disposed on the display structure PP.

The substrate SUB may include the display area DA and the non-display area NDA disposed at least at one side of the display area DA. The substrate SUB may be formed of one of various materials such as glass and polymeric metal. The substrate SUB may be an insulating substrate formed of a polymeric organic material. The polymeric organic material may be polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, the material that forms the substrate SUB is not limited thereto. For example, the substrate SUB may be formed of fiber glass reinforced plastic (FRP).

The display structure PP may be disposed on a front surface of the substrate SUB. According to an embodiment of the present inventive concept, the display structure PP may be disposed in the display area DA excluding the non-display area NDA. The display structure PP may be disposed in both the first area A1 and the second area A2.

The display structure PP may display information input by a user or information provided to the user as the image. The display structure PP may include the plurality of pixels PXL provided on the substrate SUB. The plurality of pixels PXL may be organic light emitting diodes (OLED) including an organic layer. However, the present inventive concept is not limited thereto. The plurality of pixels PXL may be liquid crystal elements, electrophoretic elements, or electrowetting elements. The plurality of pixels PXL are provided in the display area DA of the substrate SUB as minimum units that display the image. The pixels PXL may include OLEDs that emit white light and/or color light. Each of the pixels PXL may emit one of red light, green light, blue light, and white light. However, the present inventive concept is not limited thereto. For example, each of the pixels PXL may emit one of cyan light, magenta light, and yellow light. Each of the pixels PXL may include a thin film transistor (TFT) (not shown) connected to a plurality of signal wirings (not shown) and the OLED connected to the TFT. The pixel PXL, the plurality of signal wiring lines, and the plurality of TFTs will be described later.

The fingerprint sensor FPS is a sensing element that recognizes the fingerprint of the user. In FIG. 2, for convenience sake, the fingerprint sensor FPS is illustrated as being arranged on the rear surface of the substrate SUB. However, the present inventive concept is not limited thereto. For example, the fingerprint sensor FPS may be disposed between the substrate SUB and the display structure PP.

In addition, the fingerprint sensor FPS is disposed only in the first area A1 of the substrate SUB and may not be disposed in the second area A2. Although not shown in the drawing, the fingerprint sensor FPS may be connected to a fingerprint sensing circuit (not shown) through an additional wiring line, a flexible printed circuit board (FPCB), a tape carrier package, a connector, or a chip on film (COF).

The fingerprint sensor FPS may be an optical sensor or an image sensor. When the fingerprint sensor FPS is the optical sensor, the fingerprint sensor FPS may recognize the fingerprint of the user by sensing a difference in reflected light that varies in accordance with topologies of the fingerprint of the user who contacts the display panel PNL. When the fingerprint sensor FPS is the image sensor, the fingerprint sensor FPS may recognize the fingerprint of the user by capturing the fingerprint of the user who contacts the display panel PNL and comparing the captured fingerprint with a reference fingerprint pattern. According to an embodiment of the present inventive concept, the fingerprint sensor FPS may be the image sensor. The image sensor may include a charge coupled device (CCD) or a CMOS image sensor.

The fingerprint sensor FPS may recognize the fingerprint when the finger of the user moves while contacting the display panel PNL as well as when the finger of the user contacts the display panel PNL.

The touch sensor TS may be disposed on the front surface of the display panel PNL and may be integrated with the display panel PNL in the display panel PNL. According to an embodiment of the present inventive concept, the touch sensor TS is disposed on the display structure PP and may be integrated with the display panel PNL.

The touch sensor TS may include a sensor for sensing a position of a touch of the user. The sensor may be driven by a mutual capacitance method or a self-capacitance method. The touch sensor TS will be described later.

Figure 3:
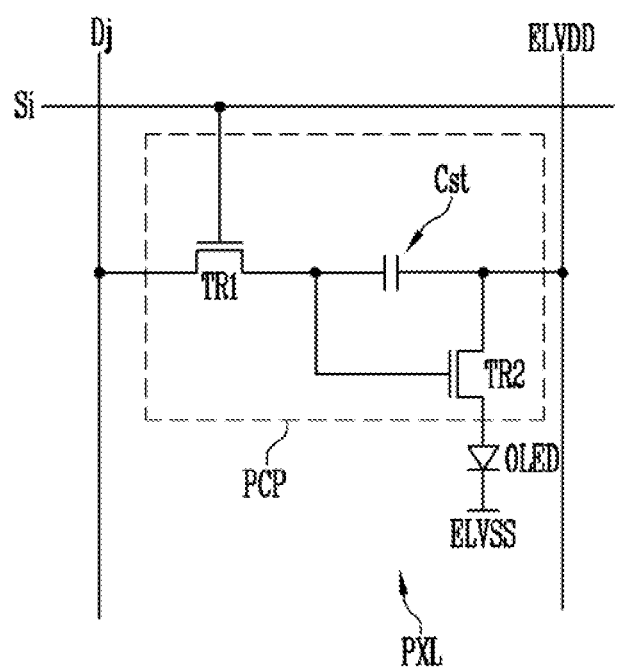
FIGS. 3 and 4 are equivalent circuit diagrams illustrating a case in which the pixel of FIG. 1 is a light emitting element.
Figure 4:
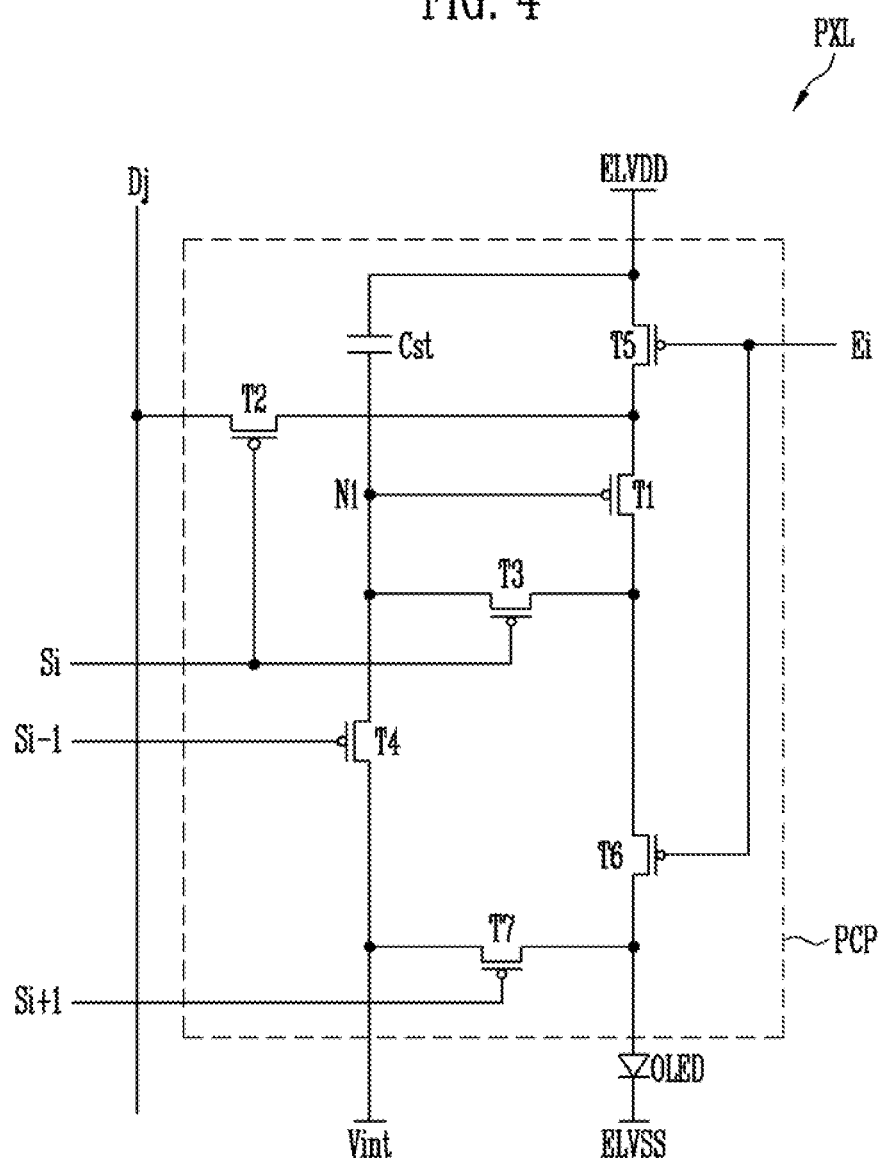

FIGS. 3 and 4 are equivalent circuit diagrams illustrating a case in which the pixel of FIG. 1 is a light emitting element.

First, referring to FIGS. 1 and 3, each of the pixels may include a pixel circuit PCP connected to a wiring line and an organic light emitting diode OLED connected to the pixel circuit PCP.

The pixel circuit PCP may include a driving transistor TR2 for controlling the organic light emitting diode OLED, a switching transistor TR1 for switching the driving transistor TR2, and a capacitor Cst connected to a first power source line ELVDD and a second power source line ELVSS which are wirings for supply source voltages.

The switching transistor TR1 may include a gate electrode, a source electrode, and a drain electrode. In the switching transistor TR1, the gate electrode is connected to an ith scan line Si and the source electrode may be connected to a jth data line Dj. The drain electrode of the switching transistor TR1 may be connected to a gate electrode of the driving transistor TR2. The switching transistor TR1 may transmit a data signal applied to the jth data line Dj to the driving transistor TR2 in accordance with a scan signal applied to the ith scan line Si.

The driving transistor TR2 may include the gate electrode, a source electrode, and a drain electrode. In the driving transistor TR2, the gate electrode is connected to the drains electrode of the switching transistor TR1, the source electrode is connected to the first power source line ELVDD, and the drain electrode may be connected to the organic light emitting diode OLED.

The organic light emitting diode OLED may include a light emitting layer and an anode electrode and a cathode electrode that face each other with the light emitting layer interposed therebetween. The anode electrode may be connected to the drain electrode of the driving transistor TR2. The cathode electrode is connected to the second power source line ELVSS so that a common voltage may be applied to the cathode electrode. The light emitting layer emits light in accordance with an output signal of the driving transistor TR2 and may display an image by emitting or not emitting light. Here, the light emitted from the light emitting layer may vary in accordance with a material of the light emitting layer and may be color light or white light.

The capacitor Cst is connected between the gate electrode and the source electrode of the driving transistor TR2 and may charge and maintain the data signal input to the gate electrode of the driving transistor TR2.

According to an embodiment of the present inventive concept, it is illustrated that the pixel circuit PCP includes the two transistors TR1 and TR2. However, the present inventive concept is not limited thereto. The pixel circuit PCP may include one transistor and one capacitor or no less than three transistors and no less than two capacitors. For example, as illustrated in FIG. 4, the pixel circuit PCP may include first through seventh transistors T1 through T7 and the capacitor Cst. When the pixel circuit PCP includes the first through seventh transistors T1 through T7 and the capacitor Cst, a connection relationship of elements included in each pixel PXL may be as follows.

Referring to FIG. 4, each pixel PXL may include the pixel circuit PCP including the first through seventh transistors T1 through T7 and the capacitor Cst and the organic light emitting diode OLED connected to the pixel circuit PCP.

The anode electrode of the organic light emitting diode OLED is connected to the first transistor T1 via the sixth transistor T6 and the cathode electrode of the organic light emitting diode OLED may be connected to the second power source line ELVSS. The organic light emitting diode OLED may generate light with predetermined brightness in response to an amount of current supplied from the first transistor T1.

A voltage of a first power source provided to the first power source line ELVDD may be set to be higher than a voltage of a second power source provided to the second power source line ELVSS so that the current may flow to the organic light emitting diode OLED.

The seventh transistor T7 may be connected between an initializing power source line Vint and the anode electrode of the organic light emitting diode OLED. A gate electrode of the seventh transistor T7 may be connected to an (i+1)th scan line Si+1. The seventh transistor T7 is turned on when a scan signal is supplied to the (i+1)th scan line Si+1 and may supply an initializing power source provided from the initializing power source line Vint to the anode electrode of the organic light emitting diode OLED. Here, a voltage of the initializing power source may be set to be lower than a voltage of the data signal provided to the jth data line Dj.

The sixth transistor T6 may be connected between the first transistor T1 and the organic light emitting diode OLED. A gate electrode of the sixth transistor T6 may be connected to an ith emission control line Ei. The sixth transistor T6 is turned off when an emission control signal is supplied to the ith emission control line Ei and may be turned on in other cases.

The fifth transistor T5 may be connected between the first power source line ELVDD and the first transistor T1. A gate electrode of the fifth transistor T5 may be connected to the ith emission control line Ei. The fifth transistor T5 is turned off when the emission control signal is supplied to the ith emission control line Ei and may be turned on in other cases.

A first electrode of the first transistor (a driving transistor) T1 is connected to the first power source line ELVSS via the fifth transistor T5 and a second electrode of the first transistor T1 may be connected to the anode electrode of the organic light emitting diode OLED via the sixth transistor T6. A gate electrode of the first transistor T1 may be connected to a first node N1. The first transistor T1 may control an amount of current that flows from the first power source line ELVDD to the second power source line ELVSS via the organic light emitting diode OLED in response to a voltage of the first node N1.

The third transistor T3 may be connected between the second electrode of the first transistor T1 and the first node N1. A gate electrode of the third transistor T3 may be connected to the ith scan line Si. The third transistor T3 is turned on when a scan signal is supplied to the ith scan line Si and may electrically connect the second electrode of the first transistor T1 and the first node N1. Therefore, when the third transistor T3 is turned on, the first transistor T1 may be diode-connected.

The fourth transistor T4 may be connected between the first node N1 and the initializing power source line Vint. A gate electrode of the fourth transistor T4 may be connected to an (i−1)th scan line Si−1. A gate electrode of the fourth transistor T4 may be connected to the (i−1)th scan line Si−1. The fourth transistor T4 is turned on when a scan signal is supplied to the (i−1)th scan line Si−1 and may supply the initializing power source to the first node N1.

The second transistor T2 may be connected between the jth data line Dj and the first electrode of the first transistor T1. A gate electrode of the second transistor T2 may be connected to the ith scan line Si. The second transistor T2 is turned on when the scan signal is supplied to the ith scan line Si and may electrically connect the jth data line Dj and the first electrode of the first transistor T1.

The capacitor Cst may be connected between the first power source line ELVDD and the first node N1. The capacitor Cst may store the data signal and a voltage corresponding to a threshold voltage of the first transistor T1.

Figure 5:
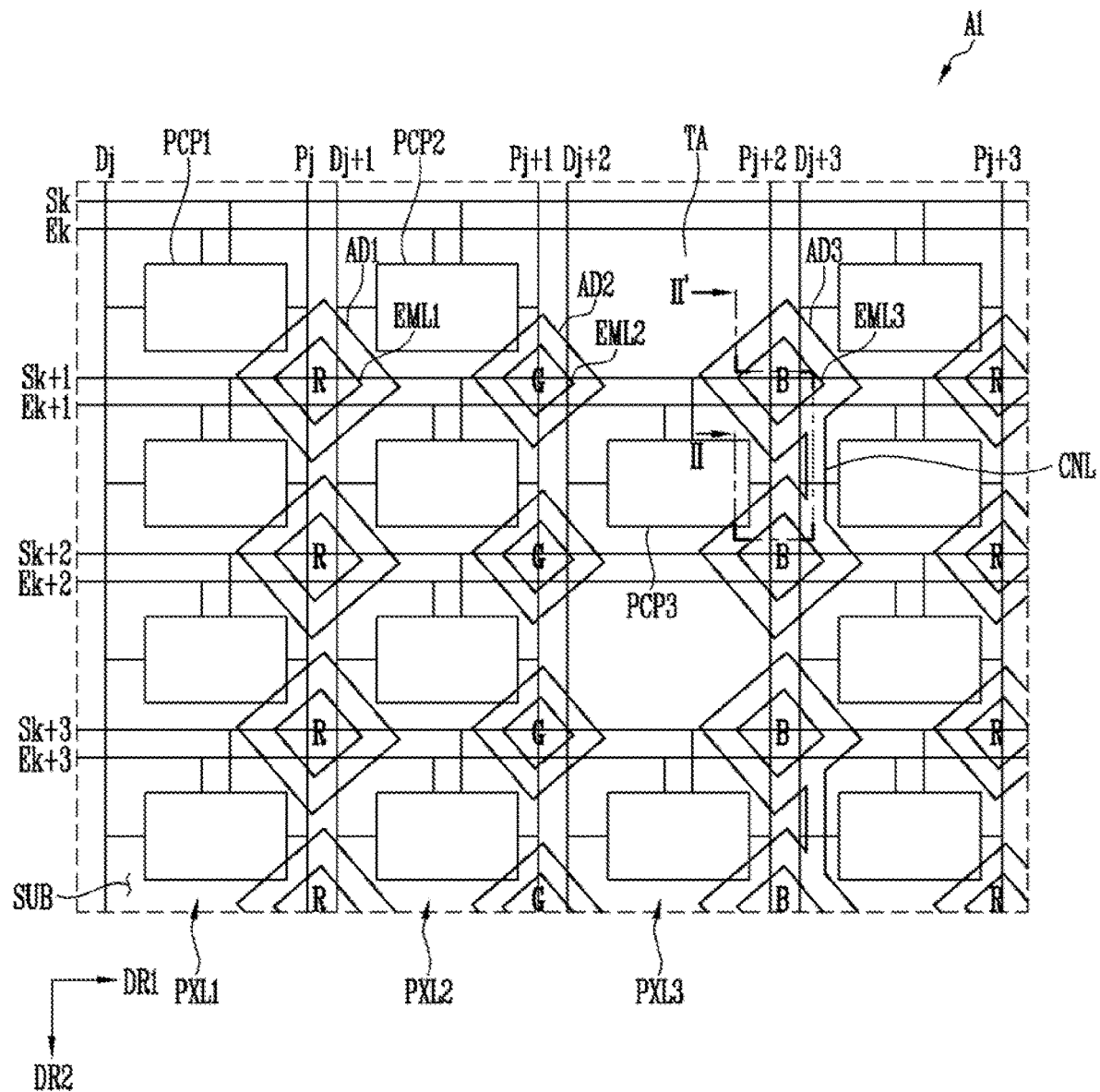
FIG. 5 is a plan view illustrating an enlargement of the first area of FIG. 1.
Figure 6:
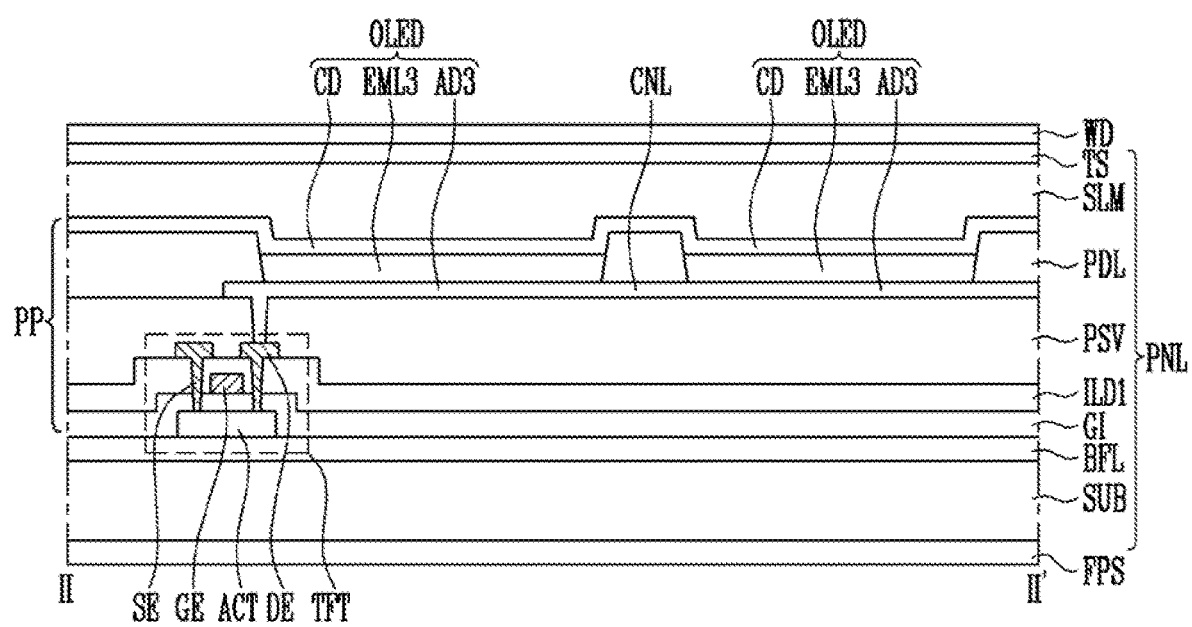
FIG. 6 is a cross-sectional view taken along the line II-II' of FIG. 5.

FIG. 5 is a plan view illustrating an enlargement of the first area of FIG. 1. FIG. 6 is a cross-sectional view taken along the line II-II' of FIG. 5.

Referring to FIGS. 1, 5, and 6, the display (refer to PP of FIG. 2) according to the present inventive concept may include the substrate SUB including the first area A1 for sensing a fingerprint and the second area A2 adjacent to the first area A1. The plurality of pixels PXL may be disposed in each of the first area A1 and the second area A2. The number of pixels PXL according to an embodiment of the present inventive concept is selected for convenience sake. A larger number of pixels PXL may be provided in each of the first and second areas A1 and A2.

The pixels PXL in the first area A1 and the pixels PXL in the second area A2 may have the same size. Therefore, the number of pixels PXL provided in a unit area in the first area A1 may be the same as the number of pixels PXL provided in a unit area in the second area A2. Therefore, resolution of the first area A1 in which fingerprint sensors FPS are provided may be the same as resolution of the second area A2 in which the fingerprint sensors FPS are not provided.

According to an embodiment of the present inventive concept, each of the pixels PXL provided in the first area A1 may include first through third sub-pixels PXL1 through PXL3. The first through third sub-pixels PXL1 through PXL3 will be described later.

The wiring line connected to the first through third sub-pixels PXL1, PXL2, and PXL3 may be provided in the first area A1.

The wiring line may include scan lines Sk through Sk+3, emission control lines Ek through Ek+3, data lines Dj through Dj+3, and power source lines Pj through Pj+3 that provide signals of a driver (not shown) to each of the sub-pixels PXL1, PXL2, and PXL3.

The scan lines Sk through Sk+3 may extend on the substrate SUB in a first direction DR1. The scan lines Sk through Sk+3 provided in the first area A1 and scan lines disposed in the second area A2 may be the same scan lines. For example, a scan line may be connected to the pixels in the first area A1 and the pixels in the second area A2. The scan lines Sk through Sk+3 may include the kth scan line Sk, the (k+1)th scan line Sk+1, the (k+2)th scan line Sk+2, and the (k+3)th scan line Sk+3 that are sequentially arranged in a second direction DR2 that intersects the first direction DR1. Scan signals from the driver may be respectively applied to the scan lines Sk through Sk+3.

The emission control lines Ek through Ek+3 may extend on the substrate SUB in the first direction DR1. The emission control lines Ek through Ek+3 provided in the first area A1 and emission control lines disposed in the second area A2 may be the same emission control lines. For example, an emission control line may be connected to the pixels in the first area A1 and the pixels in the second area A2. The emission control lines Ek through Ek+3 may include the kth emission control line Ek, the (k+1)th emission control line Ek+1, the (k+2)th emission control line Ek+2, and the (k+3)th emission control line Ek+3 that are sequentially arranged in the second direction DR2 that intersects the first direction DR1. Emission control signals from the driver may be respectively applied to the emission control lines Ek through Ek+3.

The data lines Dj through Dj+3 may extend on the substrate SUB in the second direction DR2. The data lines Dj through Dj+3 provided in the first area A1 and data lines disposed in the second area A2 may be the same data lines. For example, a data line may be connected to the pixels in the first area A1 and the pixels in the second area A2. The data lines Dj through Dj+3 may include the jth data line Dj, the (j+1)th data line Dj+1, the (j+2)th data line Dj+2, and the (j+3)th data line Dj+3 that are sequentially arranged in the first direction DR1. Data signals from the driver may be respectively applied to the data lines Dj through Dj+3.

The power source lines Pj through Pj+3 may be arranged to extend in the second direction DR2 and to be separate from the data lines Dj through Dj+3. The power source lines Pj through Pj+3 may include the jth power source line Pj, the (j+1)th power source line Pj+1, the (j+2)th power source line Pj+2, and the (j+3)th power source line Pj+3 that are sequentially arranged in the first direction DR1. The first power source (refer to ELVDD of FIG. 3) from the driver may be applied to each of the power source lines Pj through Pj+3.

The first sub-pixels PXL1 may include organic light emitting diodes and first pixel circuits PCP1 for driving the organic light emitting diodes. In addition, first light emitting areas R that emit first color light by the organic light emitting diodes may be provided in the first sub-pixels PXL1. The organic light emitting diodes may include first light emitting layers EML1 for emitting the first color light, 1-$1^{st}$ electrodes AD1 corresponding to the first light emitting layers EML1, and second electrodes CD disposed on the first light emitting layers EML1. Here, the first color light may be red light.

The first pixel circuits PCP1 may be electrically connected to the 1-$1^{st}$ electrodes AD1. In the first area A1, the first pixel circuits PCP1 may be connected to corresponding scan lines among the scan lines Sk through Sk+3, corresponding emission control lines among the emission control lines Ek through Ek+3, corresponding data lines among the data lines Dj through Dj+3, and corresponding power source lines among the power source lines Pj through Pj+3.

The second sub-pixels PXL2 may include organic light emitting diodes and second pixel circuits PCP2 for driving the organic light emitting diodes. In addition, second light emitting areas G that emit second color light by the organic light emitting diodes may be disposed in the second sub-pixels PXL2. The organic light emitting diodes may include second light emitting layers EML2 for emitting the second color light, 1-$2^{nd}$ electrodes AD2 corresponding to the second light emitting layers EML2, and second electrodes CD provided on the second light emitting layers EML2. Here, the second color light may be green light.

The second pixel circuits PCP2 may be electrically connected to the 1-$2^{nd}$ electrodes AD2. In the first area A1, the second pixel circuits PCP2 may be connected to corresponding scan lines among the scan lines Sk through Sk+3, corresponding emission control lines among the emission control lines Ek through Ek+3, corresponding data lines among the data lines Dj through Dj+3, and corresponding power source lines among the power source lines Pj through Pj+3.

The third sub-pixels PXL3 may include organic light emitting diodes OLED and third pixel circuits PCP3 for driving the organic light emitting diodes OLED. In addition, third light emitting areas B that emit third color light by the organic light emitting diodes OLED may be provided in the third sub-pixels PXL3. The organic light emitting diodes OLED may include third light emitting layers EML3 for emitting the third color light, 1-3$^{rd}$ electrodes AD3 corresponding to the third light emitting layers EML3, and second electrodes CD disposed on the third light emitting layers EML3. Here, the third color light may be blue light.

The third pixel circuits PCP3 may be electrically connected to the 1-3$^{rd}$ electrodes AD3. In the first area A1, the third pixel circuits PCP3 may be connected to corresponding scan lines among the scan lines Sk through Sk+3, corresponding emission control lines among the emission control lines Ek through Ek+3, corresponding data lines among the data lines Dj through Dj+3, and corresponding power source lines among the power source lines Pj through Pj+3.

Some of the third sub-pixels PXL3 may not include the third pixel circuits PCP3. Hereinafter, for convenience sake, the third sub-pixels PXL3 that do not include the third pixel circuits PCP3 are referred to as 3-1$^{st}$ sub-pixels PXL3 and the third sub-pixels PXL3 that include the third pixel circuits PCP3 are referred to as 3-2$^{nd}$ sub-pixels PXL3.

The organic light emitting diodes OLED of the 3-1$^{st}$ sub-pixels PXL3 may be connected to the organic light emitting diodes OLED of the 3-2$^{nd}$ sub-pixels PXL3 adjacent to the 3-1$^{st}$ sub-pixels PXL3 through connection wirings CNL.

Specifically, the 1-3$^{rd}$ electrodes AD3 of the 3-1$^{st}$ sub-pixels PXL3 may be connected to the 1-3$^{rd}$ electrodes AD3 of the 3-2$^{nd}$ sub-pixels PXL3 through the connection wirings CNL. Here, the 1-3$^{rd}$ electrodes AD3 of the 3-1$^{rd}$ sub-pixels PXL3, the connection wirings CNL, and the 1-3$^{rd}$ electrodes AD3 of the 3-2$^{rd}$ sub-pixels PXL3 may be formed by the same process and may be arranged on the same layer. In addition, the 1-3$^{rd}$ electrodes AD3 of the 3-1$^{st}$ sub-pixels PXL3, the connection wirings CNL, and the 1-3$^{rd}$ electrodes AD3 of the 3-2$^{nd}$ sub-pixels PXL3 may include the same material.

The 1-3$^{rd}$ electrodes AD3 of the 3-2$^{nd}$ sub-pixels PXL3 are connected to thin film transistors TFT of the third pixel circuits PCP3 and may receive driving signals from the thin film transistors TFT.

The 1-3$^{rd}$ electrodes AD3 of the 3-1$^{st}$ sub-pixels PXL3 may be connected to the 1-3$^{rd}$ electrodes AD3 of the 3-2$^{nd}$ sub-pixels PXL3 through the connection wirings CNL. Therefore, the driving signals supplied to the 3-2$^{nd}$ sub-pixels PXL3 may be applied to the 3-1$^{st}$ sub-pixels PXL3.

As a result, the third pixel circuits PCP3 included in the 3-2$^{nd}$ sub-pixels PXL3 may drive the 3-1$^{st}$ sub-pixels PXL3 and the 3-2$^{nd}$ sub-pixels PXL3. That is, one third pixel circuit PCP3 may drive two third sub-pixels PXL3 adjacent to each other to emit the same blue light. When the one third pixel circuit PCP3 drives the two third sub-pixels PXL3, brightness of the two third sub-pixels PXL3 may deteriorate. In order to prevent the brightness deterioration of the two third sub-pixels PXL3, according to an embodiment of the present inventive concept, the above-described structure may be applied to the third sub-pixel PXL3 that emits the blue light in which the brightness deterioration of the sub-pixel is not easily recognized.

As described above, the one third pixel circuit PCP3 may drive the two third sub-pixels PXL3. However, the present inventive concept is not limited thereto. For example, according to an embodiment, the third pixel circuit PCP3 may drive the no less than three third sub-pixels PXL3 through the connection wiring line CNL.

The 3-1$^{st}$ sub-pixels PXL3 may include the third light emitting areas B that emit the blue light and transmissive areas TA that do not include the third pixel circuits PCP3. The transmissive areas TA may transmit the blue light. The 3-2$^{nd}$ sub-pixels PXL3 may also include the third light emitting areas B that emit the blue light and transmissive areas TA that do not include the third pixel circuits PCP3.

The transmissive area TA of the 3-1$^{st}$ sub-pixels PXL3 may be larger than that of the transmissive areas TA of the 3-2$^{nd}$ sub-pixels PXL3 by an area of the third pixel circuit PCP3. In addition, since the 3-1$^{st}$ sub-pixels PXL3 do not include the third pixel circuits PCP3, elements that prevent the blue light from being transmitted may be removed. Therefore, light transmittance of the 3-1$^{st}$ sub-pixels PXL3 may be larger than light transmittance of the 3-2$^{nd}$ sub-pixels PXL3.

As described above, since the 3-1$^{st}$ sub-pixels PXL3 do not include the third pixel circuits PCP3, the transmissive areas TA may be sufficiently secured. Due to the secured transmissive areas TA, light transmittance of the first area A1 disposed in the fingerprint sensors FPS may increase. The blue light that pass through the transmissive areas TA may directly reach the fingerprint sensors FPS. In such a case, the fingerprint sensors FPS may easily sense the fingerprint of a user. As a result, a fingerprint recognition rate of the display device may increase.

Hereinafter, the 3-2$^{nd}$ sub-pixels PXL3 including the third pixel circuits PCP3 will be described as follows together with a stacking order with reference to FIG. 6.

Each of the 3-2$^{nd}$ sub-pixels PXL3 according to an embodiment of the present inventive concept may include an insulating layer disposed on the substrate SUB, a pixel defining layer PDL, the thin film transistor TFT, the organic light emitting diode OLED, and an encapsulation layer SLM. Here, the thin film transistor TFT may include an active pattern ACT, a gate electrode GE, a source electrode SE, and a drain electrode DE. The insulating layer may include a buffer layer BFL, a gate insulating layer GI, a first interlayer insulating layer ILD1, and a protective layer PSV. The organic light emitting diode OLED may include the 1-3$^{rd}$ electrode AD3, the second electrode CD, and the third light emitting layer EML3 disposed between the 1-3$^{rd}$ electrode AD3 and the second electrode CD.

The buffer layer BFL may be disposed on the substrate SUB. The buffer layer BFL prevents impurities from being diffused into the thin film transistor TFT disposed on the substrate SUB and may improve flatness of the substrate SUB. The buffer layer BFL may be a single layer or a multilayer formed of at least two layers. The buffer layer BFL may be an inorganic insulating layer formed of an inorganic material. For example, the buffer layer BFL may be formed of a silicon nitride, a silicon oxide, and a silicon oxynitride. When the buffer layer BFL is the multilayer, the respective layers may be formed of the same material or different materials. The buffer layer BFL may be omitted as occasion demands.

The active pattern ACT may be disposed on the buffer layer BFL. The active pattern ACT may be formed of a semiconductor material. The active pattern ACT may include a source area, a drain area, and a channel area disposed between the source area and the drain area. The active pattern ACT may be a semiconductor pattern formed of polysilicon, amorphous silicon, and an oxide semiconductor. The channel area may be formed of an intrinsic semiconductor that is not doped with impurities. The source area and the drain area may be formed of doped semiconductors that is doped with impurities.

The gate insulating layer GI may be disposed on the buffer layer BFL provided with the active pattern ACT. The gate insulating layer GI may be an inorganic insulating layer including an inorganic material or an organic insulating layer including an organic material.

The gate electrode GE may be disposed on the gate insulating layer GI. The gate electrode GE may be formed to cover an area corresponding to the channel area of the active pattern ACT. The gate electrode GE may be formed of a conductive material. For example, the gate electrode GE may be formed of at least one among gold (Au), silver (Ag), aluminum (Al), molybdenum (Mo), chrome (Cr), titanium (Ti), nickel (Ni), neodymium (Nd), and copper (Cu) or an alloy of the above metals. In addition, the gate electrode GE may be formed of a single layer. However, the present inventive concept is not limited thereto. The gate electrode GE may be formed of a multilayer obtained by stacking no less than two materials among the above metals and alloys thereof. According to an embodiment of the present inventive concept, although not shown, gate lines that provide scan signals to the thin film transistor TFT are disposed on the same layer as the gate electrode GE and may include the same material as the gate electrode GE.

The first interlayer insulating layer ILD1 may be disposed on the gate electrode GE and the gate insulating layer GI which is not covered by the gate electrode GE. The first interlayer insulating layer ILD1 may be an inorganic insulating layer including an inorganic material. The inorganic material may be polysiloxane, a silicon nitride, a silicon oxide, or a silicon oxynitride.

The source electrode SE and the drain electrode DE may be disposed on the first interlayer insulating layer ILD1. The source electrode SE and the drain electrode DE may be respectively connected to the source area and the drain area of the active pattern ACT through a contact hole that is formed through the first interlayer insulating layer ILD1 and the gate insulating layer GI. The source electrode SE and the drain electrode DE may be formed of a conductive material. For example, the source electrode SE and the drain electrode DE may be formed of at least one among Au, Ag, Al, Mo, Cr, Ti, Ni, Nd, and Cu or an alloy of the above metals. In addition, the source electrode SE and the drain electrode DE may be formed of a single layer. However, the present inventive concept is not limited thereto. The source electrode SE and the drain electrode DE may be formed of a multilayer obtained by stacking no less than two materials among the above metals and alloys thereof.

According to an embodiment of the present inventive concept, the thin film transistor TFT may include the active pattern ACT, the gate electrode GE, the source electrode SE, and the drain electrode DE. It is illustrated that the thin film transistor TFT has a top gate structure. However, the present inventive concept is not limited thereto. For example, the thin film transistor TFT may have a bottom gate structure.

The protective layer PSV that covers the thin film transistor TFT may be disposed on the source electrode SE and the drain electrode DE, and the first interlayer insulating layer ILD1 which is not covered by the source electrode SE and the drain electrode DE. The protective layer PSV may be an organic insulating layer including an organic material. The organic material may be an organic insulating material such as a polyacryl based compound, a polyimide based compound, a fluorine based carbon compound such as Teflon, or a benzocyclobutene compound.

The organic light emitting diode OLED may be disposed on the protective layer PSV.

The organic light emitting diode OLED may include the 1-3$^{rd}$ electrode AD3, the third light emitting layer EML3 disposed on the 1-3$^{rd}$ electrode AD3, and the second electrode CD disposed on the third light emitting layers EML3. The 1-3$^{rd}$ electrode AD3 may be disposed on the protective layer PSV and may be connected to the drain electrode DE through a contact hole that is formed through the protective layer PSV.

The pixel defining layer PDL may be disposed on the 1-3$^{rd}$ electrode AD3. The pixel defining layer PDL may expose an area corresponding to a light emitting area of each pixel (refer to PXL of FIG. 2). For example, the pixel defining layer PDL may expose upper surface of the 1-3$^{rd}$ electrode AD3 and may cover a circumference of each pixel PXL.

The third light emitting layer EML3 may be disposed on the 1-3$^{rd}$ electrode AD3 exposed by the pixel defining layer PDL and the second electrode CD may be disposed on the third light emitting layer EML3.

The 1-3$^{rd}$ electrode AD3 may be an anode and the second electrode CD may be a cathode. In addition, when the organic light emitting diode OLED may be front surface emission type OLED, the 1-3$^{rd}$ electrode AD3 may be reflective electrode and the second electrode CD may be transmissive electrode.

As described above, when the 1-3$^{rd}$ electrode AD3 may be the anode and the reflective electrode, the 1-3$^{rd}$ electrode AD3 may include a reflecting layer (not shown) and a transparent conductive layer (not shown) arranged on or under the reflecting layer. At least one of the transparent conductive layer and the reflecting layer may be connected to the drain electrode DE of the corresponding thin film transistor TFT.

The reflecting layer may include a material capable of reflecting light. For example, the reflecting layer may include at least one among Al, Ag, Cr, Mo, platinum (Pt), Ni, and an alloy of the above metals.

The transparent conductive layer may include a transparent conductive oxide. For example, the transparent conductive layer may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The 1-3$^{rd}$ electrode AD3 of the 3-2$^{nd}$ sub-pixels PXL3 may be connected to the 1-3$^{rd}$ electrode AD3 of the 3-1$^{st}$ sub-pixels PXL3 through the connection wiring line CNL disposed on the same layer.

The pixel defining layer PDL may include an organic insulating material. For example, the pixel defining layer PDL may include at least one among polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The third light emitting layer EML3 may be disposed on exposed surfaces of the 1-3$^{rd}$ electrode AD3. The third light emitting layer EML3 may have a multilayer thin film structure including at least one light generating layer LGL. For example, the third light emitting layer EML3 may include a hole injection layer HIL for injecting holes, a hole transport layer HTL, with high transportability of holes, for preventing electrons that are not combined in the light generating layer from moving and increasing recombination probability of holes and electrons, the light generating layer for emitting light by recombination of the injected electrons and holes, a hole blocking layer HBL for preventing electrons that are not combined in the light generating layer from moving, an electron transport layer ETL for smoothly transporting electrons to the light generating layer, and an electron injection layer EIL for injecting electrons. In addition, in each of the third light emitting layers EML3, the hole injection layer HIL, the hole transport layer HTL, the hole blocking layer HBL, the electron transport layer ETL, and the electron injection layer EIL may be common layers commonly arranged in the sub-pixels PXL1, PXL2, and PXL3 adjacent to each other.

The second electrode CD may be disposed on the pixel defining layer PDL and the third light emitting layer EML3. The second electrode CD may cover the pixel defining layer PDL and the third light emitting layer EML3 and may be disposed on the substrate SUB to cover entire surface of the display area DA. The second electrode CD may be formed of a metal, an alloy, a metal nitride, a conductive metal oxide, and a transparent conductive material. At least two layer of the above mentioned material may be used to form the second electrode CD The encapsulation layer SLM may be disposed on the second electrode CD. The encapsulation layer SLM may be formed of a single layer or a multilayer. According to an embodiment of the present inventive concept, the encapsulation layer SLM may be formed of a triple layer. The encapsulation layer SLM may be formed of an organic material and/or an inorganic material. The encapsulation layer SLM positioned in the outermost part may be formed of the inorganic material. According to an embodiment of the present inventive concept, the encapsulation layer SLM may be formed of an inorganic material/an organic material/ an inorganic material. However, the present inventive concept is not limited thereto. The organic material may be an organic insulating material such as a polyacryl based compound, a polyimide based compound, a fluorine based carbon compound such as Teflon, or a benzocyclobutene compound. The inorganic material may be polysiloxane, a silicon nitride, a silicon oxide, or a silicon oxynitride.

The touch sensor TS is disposed on the encapsulation layer SLM and a window WD may be disposed on the touch sensor TS.

Figure 7:
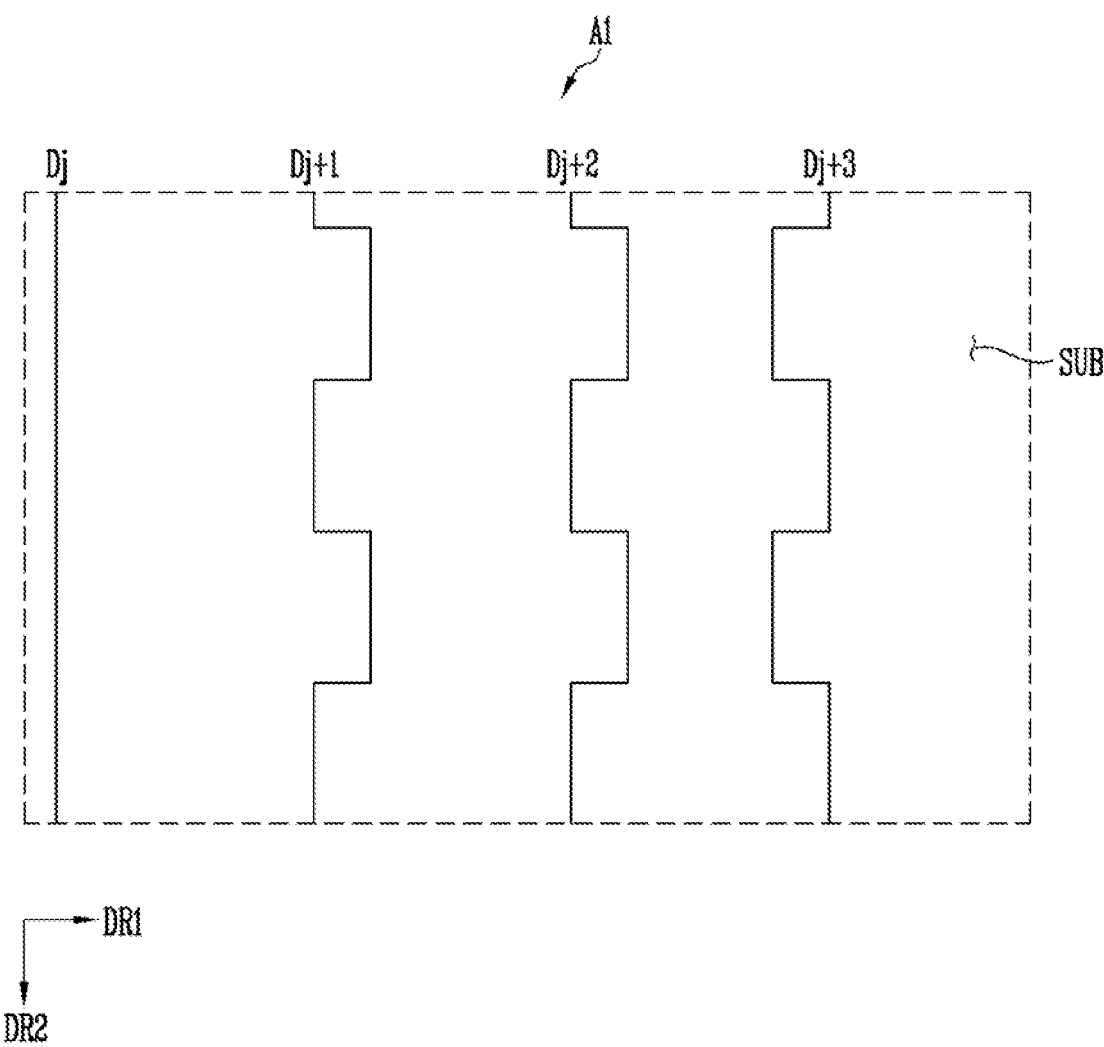
FIG. 7 is a plan view illustrating that data lines are arranged in the first area of FIG. 5 in the display device according to the present inventive concept.

FIG. 7 is a plan view illustrating that data lines are arranged in the first area of FIG. 5 in the display device according to the present inventive concept. In FIG. 7, for convenience sake, only the data lines provided on the substrate are illustrated.

Referring to FIGS. 5 and 7, data lines Dj, Dj+1, Dj+2, and Dj+3 may be disposed on the first area A1 of a substrate SUB that recognizes a fingerprint of a user.

The data lines Dj, Dj+1, Dj+2, and Dj+3 may have different shapes. Specifically, the jth data line Dj extends in the second direction DR2 of the substrate SUB, the (j+1)th data line Dj+1 extends in the second direction DR2 of the substrate SUB and may include a bent portion that is bent a plurality of times in the first direction DR1 that intersects the second direction DR2, the (j+2)th data line Dj+2 extends in the second direction DR2 of the substrate SUB and may include a bent portion that is bent a plurality of times in the first direction DR1, and the (j+3)th data line Dj+3 extends in the second direction DR2 of the substrate SUB and may include a bent portion that is bent a plurality of times in the first direction DR1. At this time, the bent portion of the (j+3)th data line Dj+3 may be bent in an opposite direction to the direction in which the bent portion of the (j+2)th data line Dj+2 is bent.

As described above, when the shapes of the data lines Dj, Dj+1, Dj+2, and Dj+3 on the first area A1 change, the transmissive areas TA in the first area A1 may increase. In such a case, the light transmittance rate in the first area A1 may increase.

The change in shapes of the data lines Dj, Dj+1, Dj+2, and Dj+3 is not limited thereto. For example, the shapes of the data lines Dj, Dj+1, Dj+2, and Dj+3 may vary in a range in which the transmissive areas TA of the first area A1 may increase.

Figure 8:
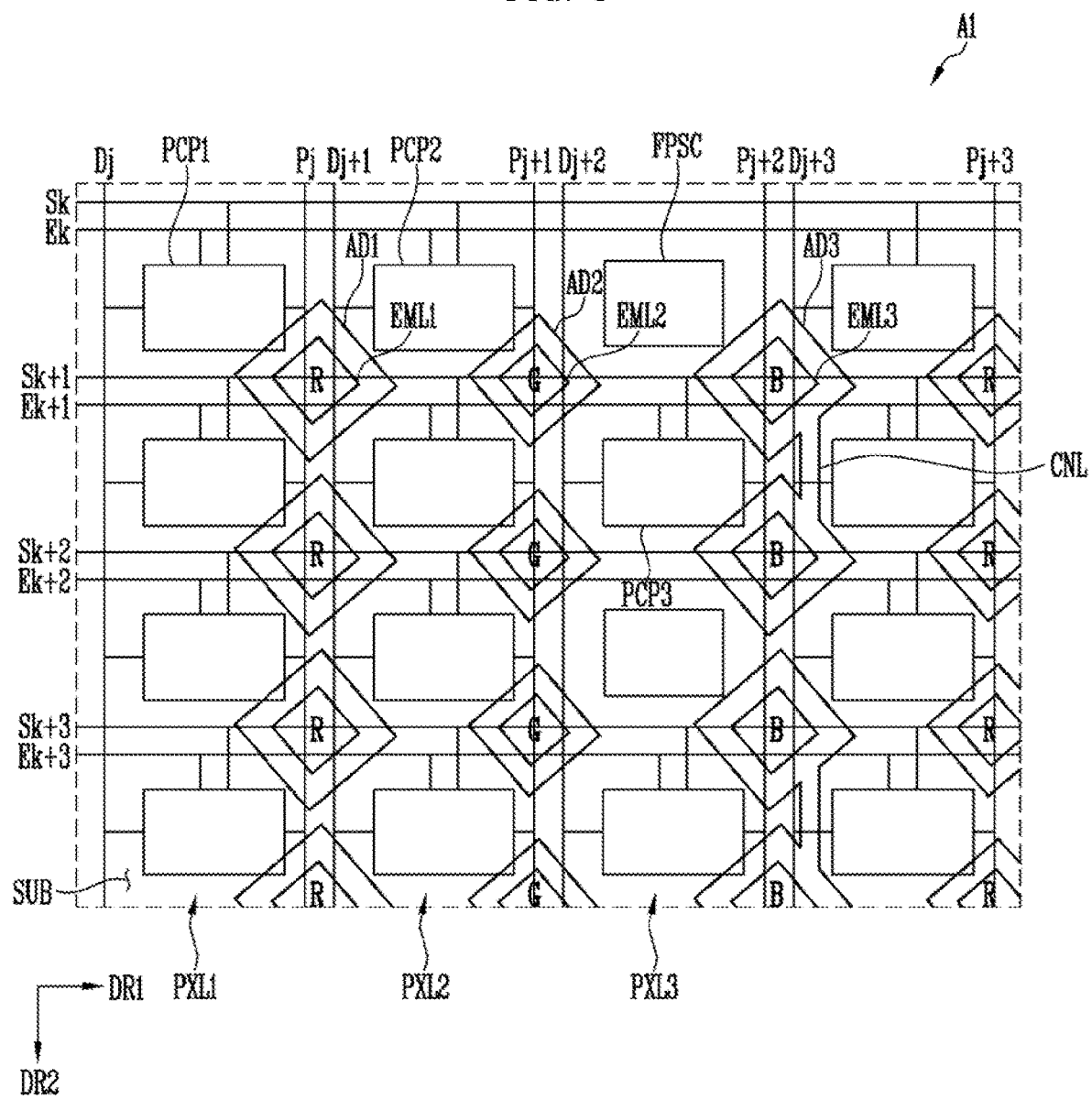
FIG. 8 is a plan view of a first area according to another embodiment of the present inventive concept.

FIG. 8 is a plan view of a first area according to another embodiment of the present inventive concept. Hereinafter, in order not to give repeated description, different elements will be mainly described. The same elements are denoted by the same reference numerals.

Referring to FIG. 8, in a first area A1 of a substrate SUB that recognizes a fingerprint of a user, first through third sub-pixels PXL1 through PXL3 and a wiring line connected to the first through third sub-pixels PXL1 through PXL3 may be provided.

The wiring line may include scan lines Sk through Sk+3, emission control lines Ek through Ek+3, data lines Dj through Dj+3, and power source lines Pj through Pj+3 that provide signals of a driver (not shown) to each of the sub-pixels PXL1, PXL2, and PXL3.

The first sub-pixels PXL1 may include organic light emitting diodes and first pixel circuits PCP1 for driving the organic light emitting diodes. In addition, first light emitting areas R that emit red light by the organic light emitting diodes OLED may be disposed in the first sub-pixels PXL1.

The second sub-pixels PXL2 may include organic light emitting diodes and second pixel circuits PCP2 for driving the organic light emitting diodes. In addition, second light emitting areas G that emit green light by the organic light emitting diodes may be provided in the second sub-pixels PXL2.

The third sub-pixels PXL3 may include organic light emitting diodes (refer to OLED of FIG. 6) and third pixel circuits PCP3 for driving the organic light emitting diodes OLED. In addition, third light emitting areas B that emit blue light by the organic light emitting diodes OLED may be provided in the third sub-pixels PXL3. Here, the third sub-pixels PXL3 may be divided into third sub-pixels PXL3 including the third pixel circuits PCP3 and third sub-pixels PXL3 that do not include the third pixel circuits PCP3. Hereinafter, for convenience sake, the third sub-pixels PXL3 that do not include the third pixel circuits PCP3 are referred to as 3-1$^{st}$ sub-pixels PXL3 and the third sub-pixels PXL3 that include the third pixel circuits PCP3 are referred to as 3-2$^{nd}$ sub-pixels PXL3.

1-3$^{rd}$ electrodes AD3 of the 3-2$^{nd}$ sub-pixels PXL3 are connected to thin film transistors (refer to TFT of FIG. 5) of the third pixel circuits PCP3 and may receive driving signals from the thin film transistors TFT. 1-3$^{nd}$ electrodes AD3 of the 3-1$^{st}$ sub-pixels PXL3 may be connected to the 1-3$^{rd}$ electrodes AD3 of the 3-2$^{nd}$ sub-pixels PXL3 through connection wirings CNL. Therefore, the driving signals supplied to the 3-2$^{nd}$ sub-pixels PXL3 may be applied to the 3-1$^{st}$ sub-pixels PXL1 through the connection wiring lines.

The 3-1$^{st}$ sub-pixels PXL3 may include the third light emitting areas B that emit the blue light and transmissive areas (refer to TA of FIG. 4) which do not include the third pixel circuits PCP3. The transmissive areas TA may transmit the blue light.

According to an embodiment of the present inventive concept, fingerprint sensing circuits FPSC may be disposed in the transmissive areas TA. The fingerprint sensing circuits FPSC are connected to fingerprint sensors (FPS of FIG. 5), may control operations of the fingerprint sensors FPS, and may sense the fingerprint of a user by sensing information (for example, an image or an amount of change in light) of the fingerprint sensors FPS. Since the fingerprint sensing circuits FPSC are disposed in the 3-1$^{st}$ sub-pixels PXL3, the sensing information of the fingerprint sensors FPS is obtained in real time and the fingerprint of the user may be rapidly sensed.

Figure 9:
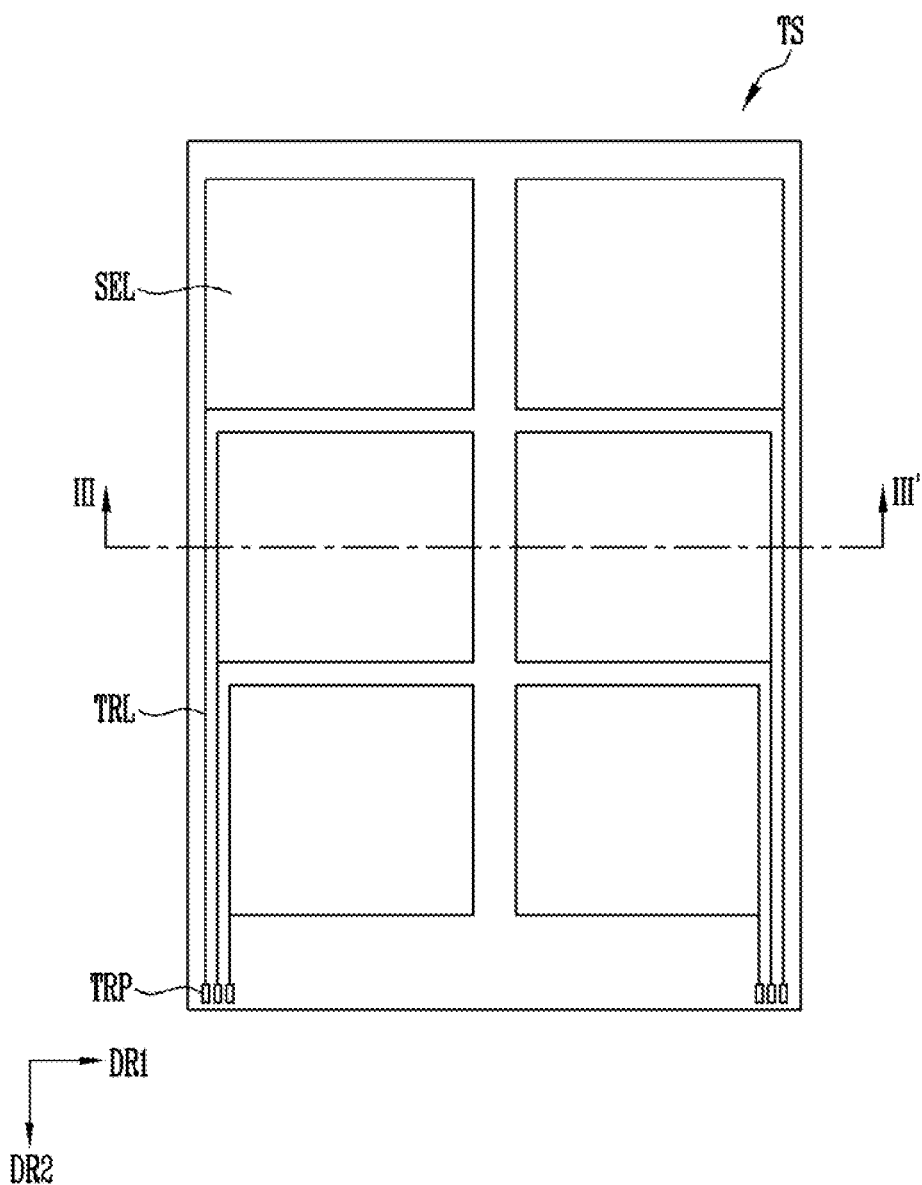
FIG. 9 is a plan view illustrating a touch sensor of a magnetic capacitance method.
Figure 10:
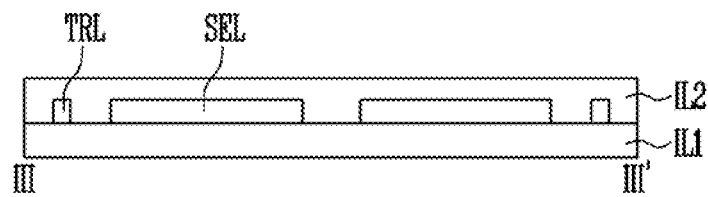
FIG. 10 is a cross-sectional view taken along the line III-III' of FIG. 9.

FIG. 9 is a plan view illustrating a touch sensor of a self-capacitance method. FIG. 10 is a cross-sectional view taken along the line III-III' of FIG. 9.

Referring to FIGS. 9 and 10, the touch sensor TS according to an embodiment of the present inventive concept may include a plurality of sensors SEL, wirings TRL, and pads TRP each connected to one end of each of the wirings TRL.

According to an embodiment of the present inventive concept, the sensors SEL are illustrated as being square. However, the present inventive concept is not limited thereto. Shapes of the sensors SEL may vary. For example, each of the sensors SEL may be circular or may extend in one direction so that the sensors SEL may be entirely stripe shaped. The sensors SEL may extend in the first direction DR1 of the substrate (refer to SUB of FIG. 2) of the display panel (refer to PNL of FIG. 2), in the second direction DR2 that intersects the first direction DR1, or in a direction inclined to the substrate.

The sensors SEL may include a conductive material, for example, metals, an alloy of the metals, conductive polymer, or a conductive metal oxide. According to an embodiment of the present inventive concept, the metals may include copper (Cu), Ag, Au, Pt, Pd, Ni, Sn, aluminum (Al), cobalt (Co), rhodium (Rh), Ir, iron (Fe), ruthenium (Ru), osmium (Os), manganese (Mn), Mo, W, niobium (Nb), tantalum (Ta), titanium (Ti), bismuth (Bi), antimony (Sb), and lead (Pb). The conductive metal oxide may be indium tin oxide (ITO), indium zinc oxide (IZO), antimony zinc oxide (AZO), indium tin zinc oxide (ITZO), zinc oxide (ZnO), or tin oxide ($SnO_2$). According to an embodiment of the present inventive concept, the sensors SEL may be formed of a single layer or a multilayer. The conductive polymer may be one of a polythiophene-based compound, a polypyrole-based compound, a polyanyline-based compound, a polyacetylene-based compound, a polyphenylene-based compound, and a mixture of the above compounds. In particular, a PEDOT/PSS compound may be used as the polythiophene-based compound. Since the conductive polymer may be easily manufactured and is more flexible than the conductive metal oxide, for example, ITO, probability of generating crack during the bending of the conductive polymer may be reduced.

The sensors SEL and the wirings TRL are implemented on an additional substrate or may be implemented on various elements included in the display device (refer to DP of FIG. 1). According to an embodiment of the present inventive concept, the sensors SEL and the wirings TRL may be formed on the display PP used for the display device (refer to DP of FIG. 1). Specifically, the sensors SEL and the wirings TRL may be formed on a first insulating layer IL1 disposed on the display PP. According to an embodiment of the present inventive concept, the first insulating layer IL1 may be the encapsulation layer (refer to SLM of FIG. 5) disposed on the display PP. A second insulating layer IL2 may be disposed on the sensors SEL and the wirings TRL. The second insulating layer IL2 may electrically insulate the sensors SEL and the wirings TRL from each other.

When the sensors SEL and the wirings TRL are implemented on the additional insulating substrate, the substrate may be formed of an insulating material such as glass or resin. In addition, the substrate may be formed of a flexible material so as to be curved or folded and may have a single layer structure or a multilayer structure. For example, the substrate may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material that forms the substrate may vary and may include FRP.

The wirings TRL may be connected between the sensors SEL and the pads TRP. In addition, the wirings TRL may be connected to the driver (not shown) through the pads TRP. For example, the pads TRP may be connected to the driver (not shown) through an additional wiring, an FPCB, a tape carrier package, a connector, or a COF.

When a touch is input to the touch sensor TS, since self-capacitance of the sensors SEL in which a touch occurred changes, the driver may detect the touch position by using a signal output from the sensors SEL.

Figure 11:
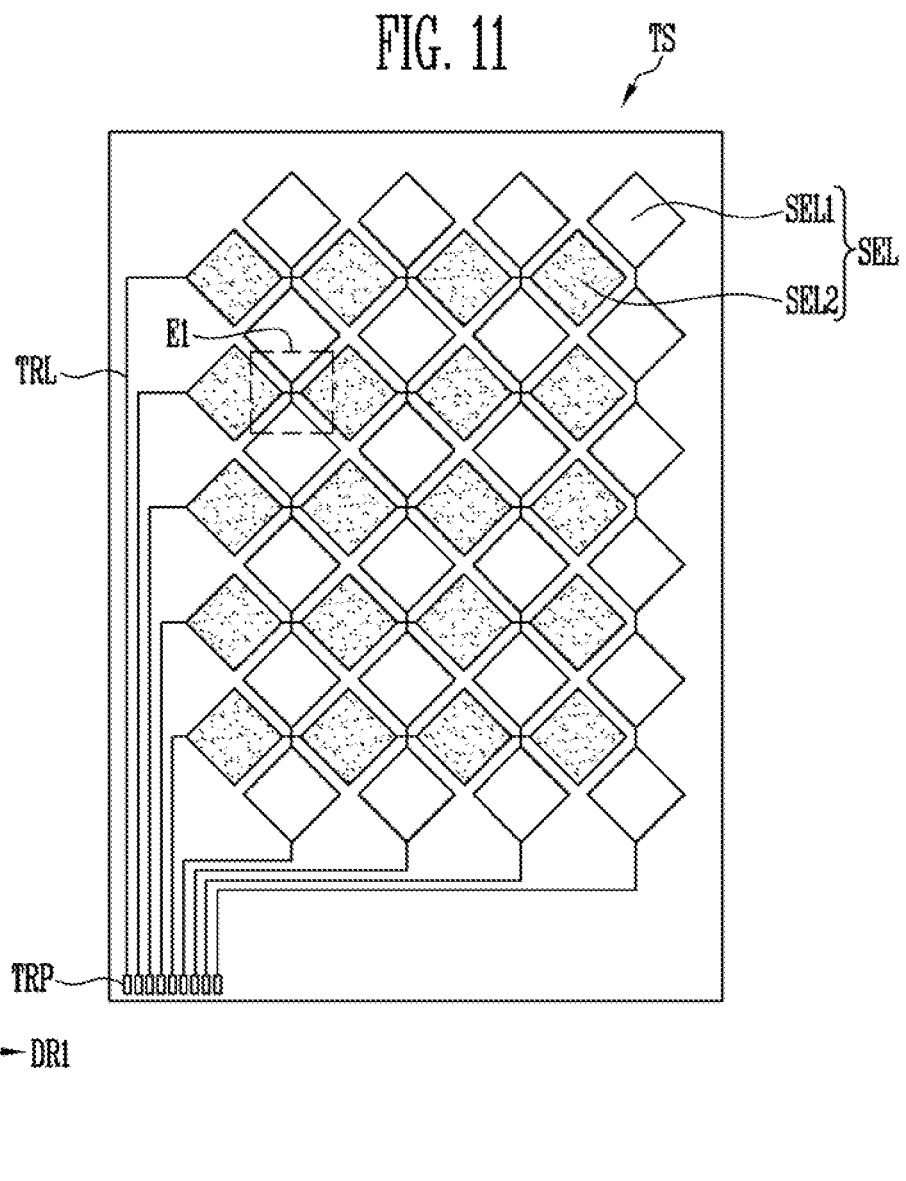
FIG. 11 is a plan view illustrating a touch sensor of a mutual capacitance method.
Figure 12:
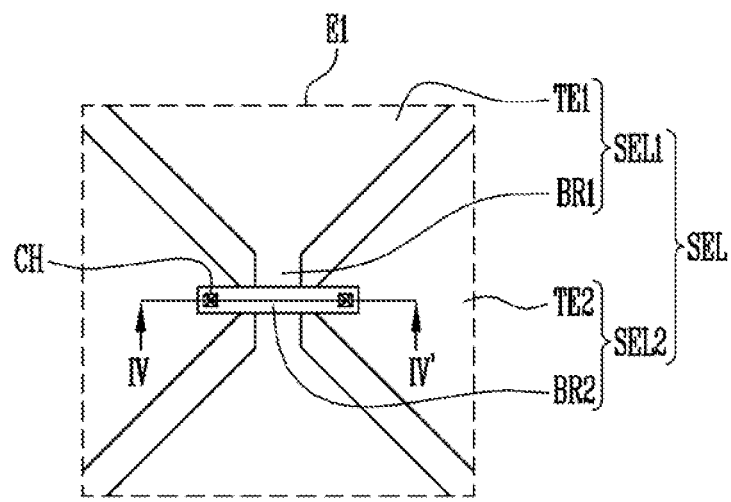
FIG. 12 is an enlarged plan view of the part E1 of FIG. 11.
Figure 13:
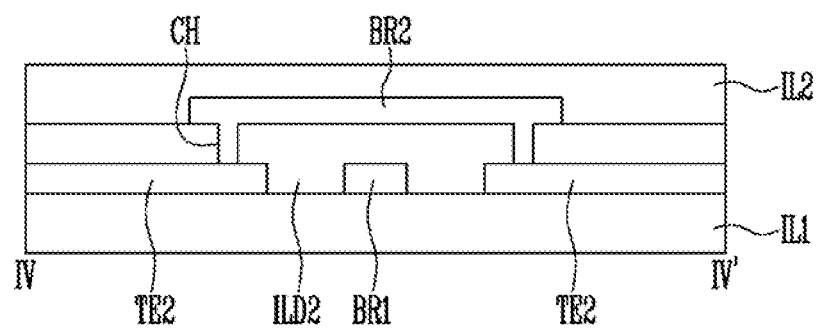
FIG. 13 is a cross-sectional view taken along the line IV-IV' of FIG. 12.

FIG. 11 is a plan view illustrating a touch sensor of a mutual capacitance method. FIG. 12 is an enlarged plan view of the part E1 of FIG. 11. FIG. 13 is a cross-sectional view taken along the line IV-IV' of FIG. 12.

Referring to FIGS. 11 through 13, the touch sensor TS according to an embodiment of the present inventive concept may include a sensor SEL, wirings TRL, and pads TRP each connected to one end of each of the wirings TRL.

The sensor SEL may include a plurality of first electrode SEL1 that extend in the second direction DR2 of the substrate (refer to SUB of FIG. 2) of the display panel (refer to PNL of FIG. 2) and to which a sensing voltage is applied and a plurality of second electrode SEL2 that extend in the first direction DR1 that intersects the second direction DR2. The first electrode SEL1 are capacitively coupled with the second electrode SEL2 and a capacitance between the first electrode SEL1 and the second electrode SEL2 may be changed when a touch is occurred.

Each of the first electrode SEL1 may include a plurality of first sensing electrodes TE1 arranged in the second direction DR2 and a plurality of first bridges BR1 that connect the adjacent first sensing electrodes TE1. The first sensing electrodes TE1 may be polygons including squares such as rods or diamonds. According to an embodiment of the present inventive concept, the first sensing electrodes TE1 and the first bridges BR1 may have a plate shape or a mesh shape formed of fine lines.

Each of the second sensors SEL2 may include a plurality of second sensing electrodes TE2 arranged in the first direction DR1 and a plurality of second bridges BR2 that connect the adjacent second sensing electrodes TE2. The second sensing electrodes TE2 may be polygons including squares such as rods or diamonds. According to an embodiment of the present inventive concept, the second sensing electrodes TE2 and the second bridges BR2 may have a plate shape or a mesh shape formed of fine lines. Here, each of the second bridges BR2 may electrically connect the adjacent second sensing electrodes TE2 through a contact hole CH.

The first sensing electrodes TE1 and the second sensing electrodes TE2 may be alternately arranged on the substrate SUB in a matrix shape.

The first sensing electrodes TE1 and the second sensing electrodes TE2 may be insulated from each other. In particular, in FIG. 11, the first bridges BR1 and the second bridges BR2 are illustrated as alternating each other. However, the first bridges BR1 and the second bridges BR2 may insulate from each other with a second interlayer insulating layer ILD2 interposed therebetween. The first sensing electrodes TE1 and the second sensing electrodes TE2 may be provided on different planes. However, the present inventive concept is not limited thereto. According to an embodiment of the present inventive concept, the first sensing electrodes TE1 and the second sensing electrodes TE2 may be provided on the same plane.

Due to the above arrangement of the first sensing electrodes TE1 and the second sensing electrodes TE2, mutual capacitance is formed between the first sensing electrodes TE1 and the second sensing electrodes TE2 and, when a touch is input to the touch sensor TS, mutual capacitance in which the touch occurred changes. In order to prevent the first sensing electrodes TE1 and the second sensing electrodes TE2 from contacting each other, the second interlayer insulating layer ILD2 may be provided between the first sensing electrodes TE1 and the second sensing electrodes TE2. The second interlayer insulating layer ILD2 is entirely provided between the first sensing electrodes TE1 and the second sensing electrodes TE2 or may be locally provided at intersections of the first sensing electrodes TE1 and the second sensing electrodes TE2.

The first sensing electrodes TE1 and the second sensing electrodes TE2 may be formed of a transparent conductive material or other conductive materials such as an opaque metal. For example, the first sensing electrodes TE1 and the second sensing electrodes TE2 may be formed of the same material as the above-described sensors (refer to SEL of FIG. 9).

The wirings TRL may be connected between the sensor SEL and the pads TRP. In addition, the wirings TRL may be connected to the driver (not shown) through the pads TRP. For example, the pads TRP may be connected to the driver through an additional wiring line, an FPCB, a tape carrier package, a connector, or a COF.

The first sensing electrodes TE1 receive a driving signal from the driver and the second sensing electrodes TE2 may output a sensing signal to which the change in capacitance is reflected to the driver. Therefore, the driver may detect a touch position by using the sensing signal output from the second sensing electrodes TE2.

Hereinafter, referring to FIG. 13, the sensor SEL will be described in accordance with a stacking order.

Referring to FIG. 13, the first sensing electrodes TE1 (not shown), the first bridges BR1, and the second sensing electrodes TE2 may be provided on the first insulating layer IL1.

The first insulating layer IL1 may be a flexible insulating material. According to an embodiment of the present inventive concept, the first insulating layer IL1 may be the encapsulation layer SLM provided on the display panel PNL. Specifically, the first insulating layer IL1 is arranged in the outermost part of the encapsulation layer SLM and may be an insulating material including an inorganic material.

The first sensing electrodes TE1, the first bridges BR1, and the second sensing electrodes TE2 include the same material and may be disposed on the same surface of the first insulating layer IL1.

The second interlayer insulating layer ILD2 including the contact hole CH may be disposed on the first sensing electrodes TE1, the first bridges BR1, and the second sensing electrodes TE2. As described above, the second interlayer insulating layer ILD2 is entirely disposed between the first sensing electrodes TE1 and the second sensing electrodes TE2 or may be locally disposed at intersections of the first sensing electrodes TE1 and the second sensing electrodes TE2.

The second bridges BR2 may be disposed on the second interlayer insulating layer ILD2. The second bridges BR2 may be connected to the second sensing electrodes TE2 through the contact hole CH. Therefore, the second sensing electrodes TE2 may be electrically connected to the adjacent second sensing electrodes TE2.

The second insulating layer IL2 may be disposed on the second bridges BR2. The second insulating layer IL2 covers the second bridges BR2 and may protect the second bridges BR2.

According to an embodiment of the present inventive concept, the second bridges BR2 are illustrated as being arranged in the uppermost layer. However, the present inventive concept is not limited thereto. For example, the second bridges BR2 are first disposed on the first insulating layer IL1 and the second interlayer insulating layer ILD2 and the first and second sensing electrodes TE1 and TE2 may be sequentially disposed on the second bridges BR2.

The display device according to an embodiment of the present inventive concept may be applied to one of various electronic devices. For example, the display device may be applied to a television, a laptop computer, a mobile phone, a smart phone, a smart pad PD, a portable multimedia player (PMP), a personal digital assistant (PDA), a navigator, or a wearable device such as a smart watch.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A display device comprising:
   a substrate including a display area that includes a first area and a second area adjacent to each other and a peripheral area that surrounds at least one side of the display area;
   a plurality of pixels provided in the display area, each of the plurality of pixels provided in the display area including a first sub-pixel, a second sub-pixel and a third sub-pixel, each of the first sub-pixel, the second sub-pixel and the third sub-pixel including a light emitting area that emits light;
   a light emitting element of light emitting elements that is disposed in each of the light emitting area of the first sub-pixel, the second sub-pixel and the third sub-pixel;
   a touch sensor disposed on the light emitting elements; and
   a fingerprint sensor disposed in the first area,
   wherein at least one of the light emitting elements is electrically connected to an adjacent light emitting element that emits light of a same color, and the same color is one of red, green, blue, white, cyan, magenta, and yellow light.

2. The display device of claim 1, wherein light transmittance of the first area is larger than light transmittance of the second area.

3. The display device of claim 2, wherein at least one of the first sub-pixel, the second sub-pixel and the third sub-pixel disposed in the first area does not include a pixel circuit.

4. The display device of claim 3, wherein the light emitting elements comprise:
 a first light emitting element disposed in a light emitting area of the first sub-pixel to emit light of a first color,
 a second light emitting element disposed in a light emitting area of the second sub-pixel to emit light of a second color; and
 a third light emitting element disposed in a light emitting area of the third sub-pixel to emit light of a third color.

5. The display device of claim 4, wherein the light of the first color is red light, the light of the second color is green light, and the light of the third color is blue light.

6. The display device of claim 5, wherein the third light emitting element comprises:
 a light emitting layer for emitting the blue light;
 a first electrode disposed between the substrate and the light emitting layer; and
 a second electrode disposed on the light emitting layer.

7. The display device of claim 6, wherein, in the first area, the first electrode of the third light emitting element is connected to a first electrode of a neighboring third light emitting element.

8. The display device of claim 7, wherein, in the first area, some of the third sub-pixels comprise the pixel circuits.

9. The display device of claim 8, wherein some of the third sub-pixels include transmissive areas that transmit light.

10. The display device of claim 9, wherein light transmittance of the some of the third sub-pixels is larger than light transmittance of the remaining third sub-pixels.

11. The display device of claim 9, wherein a fingerprint sensing circuit connected to the fingerprint sensor is disposed in the transmissive area.

12. The display device of claim 11, wherein the fingerprint sensor is an image sensor.

13. The display device of claim 1, wherein the touch sensor includes at least one of a self-capacitance touch sensor and a mutual capacitance touch sensor.

14. The display device of claim 13, wherein the touch sensor comprises:
 a first touch electrode; and
 a second touch electrode separate from the first touch electrode to form capacitance with the first touch electrode.

15. The display device of claim 1, further comprising a plurality of thin film transistors disposed in the display area and respectively connected to the light emitting elements.

16. A display device comprising:
 a substrate including a display area that includes a first area and a second area adjacent to each other and a peripheral area that surrounds at least one side of the display area;
 a plurality of pixels provided in the display area, each of the plurality of pixels provided in the display area including a first sub-pixel, a second sub-pixel and a third sub-pixel, each of the first sub-pixel, the second sub-pixel and the third sub-pixel including a light emitting area that emits light; and
 a light emitting element of light emitting elements that is disposed in each of the light emitting area of the first sub-pixel, the second sub-pixel and the third sub-pixel,
 wherein at least one of the light emitting elements are electrically connected to adjacent light emitting elements that emit light of a same color, and the same color is one of red, green, blue, white, cyan, magenta, and yellow light.

17. The display device of claim 15, wherein at least one of the first sub-pixel, the second sub-pixel and the third sub-pixel disposed in the first area does not include a pixel circuits.

18. The display device of claim 16, further comprising:
 a touch sensor disposed on the light emitting elements to sense a touch position of a user; and
 a fingerprint sensor disposed in the first area.

* * * * *